United States Patent [19]

Choi et al.

[11] Patent Number: 5,297,085
[45] Date of Patent: Mar. 22, 1994

[54] SEMICONDUCTOR MEMORY DEVICE WITH REDUNDANT BLOCK AND CELL ARRAY

[75] Inventors: Kyu-Hyun Choi, Seoul; Hyun -Kun Byun; Jung-Ryul Lee, both of Suwon; Choong-Kun Kwak, Seoul, all of Rep. of Korea

[73] Assignee: SamSung Electronics Co., Ltd., Suwon, Rep. of Korea

[21] Appl. No.: 800,701

[22] Filed: Dec. 2, 1991

Related U.S. Application Data

[63] Continuation of Ser. No. 359,685, May 31, 1989, abandoned.

[30] Foreign Application Priority Data

May 24, 1989 [KR] Rep. of Korea ............... 1989-6959

[51] Int. Cl.[5] .................. G11C 7/00; G11C 8/00; G11C 29/00
[52] U.S. Cl. .................. 365/200; 365/230.03; 365/230.06
[58] Field of Search .......... 365/200, 230.06, 203, 365/230.03

[56] References Cited

U.S. PATENT DOCUMENTS

| | | | |
|---|---|---|---|
| 4,194,130 | 3/1980 | Moench | 365/230.06 |
| 4,547,867 | 10/1985 | Reese | 365/200 |
| 4,566,081 | 1/1986 | Ochii | 365/200 |
| 4,601,019 | 7/1986 | Shah et al. | 365/200 |
| 4,604,730 | 8/1986 | Yoshida et al. | 365/200 |
| 4,800,535 | 1/1989 | McAlpine | 365/200 |
| 4,807,191 | 2/1989 | Flannagan | 365/200 |
| 4,817,056 | 3/1989 | Furutani et al. | 365/200 |
| 4,829,480 | 5/1989 | Seo | 365/200 |
| 4,837,747 | 6/1989 | Dosaka et al. | 365/200 |
| 4,849,938 | 7/1989 | Furutani et al. | 365/200 |
| 4,890,262 | 12/1989 | Hashimoto et al. | 365/200 |
| 4,951,253 | 8/1990 | Sahara et al. | 365/200 |
| 5,124,948 | 6/1992 | Takizawa et al. | 365/200 X |

*Primary Examiner*—Joseph L. Dixon
*Assistant Examiner*—Michael A. Whitfield
*Attorney, Agent, or Firm*—Robert E. Bushnell

[57] ABSTRACT

A semiconductor a semiconductor memory device including a plurality of normal blocks containing only normal memory cells without a redundant memory cell and a redundant block containing only redundant memory cells. The device comprises a plurality of normal blocks each having a plurality of normal row and column lines each connected with a plurality of normal memory cells; a redundant block having a plurality of redundant row and column lines each connected with a plurality of redundant memory cells; block decoder for selecting one of the normal blocks in response to first address signals; a redundant column decoder being programmed to select redundant columns replacing normal columns which are containing defective normal memory cells according to the output signals of the block decoder and second address signals, the decoder producing redundant operation signals when a defective normal memory cell is addressed; a redundant clock generator for producing a redundant control clock in response to the redundant operation signals; and a plurality of normal column decoders associated with the normal columns in the respective normal blocks, whereby the decoders all are disabled by the redundant control clock when a defective normal memory cell is addressed, and one of the decoders is enabled by the output signals of the block decoder for selecting a normal column line addressed by the second address signals when a defect-free normal memory cell is addressed.

32 Claims, 11 Drawing Sheets

SEMICONDUCTOR MEMORY DEVICE WITH REDUNDANT BLOCK AND CELL ARRAY

This is a continuation of application Ser. No. 07/359,685 filed on May 31, 1989 now abandoned.

BACKGROUND OF THE INVENTION

The present invention relates to a semiconductor memory device and, more particularly, to a semiconductor memory device with a redundant block containing a spare or redundant memory cell array therein.

According to the trend of high density of semiconductor memory devices, redundancy techniques are employed to substitute defective normal memory cells with defect-free redundant memory cells in order to improve the yield of products. At the same time, high-density semiconductor memory devices require division of memory cells into a plurality of blocks containing predetermined memory cells in order to achieve high-speed operation and low power consumption. Generally, since memory cells in semiconductor memory devices have relatively more defects in columns, the semiconductor memory devices arrange spare or redundant columns in which redundant memory cells are associated with each block and have used a column redundancy scheme which replaces normal column containing a defective normal memory cell or cells with redundant column having defect-free redundant memory cells in the same block.

Such prior art technique has a problem that may not effect column redundancy, where the number of defective normal columns in any one of blocks is more than that of replaceable redundant columns in the same block. Moreover, in semiconductor memory devices having a plurality of blocks, increasing the number of replaceable redundant columns per each block incurs the enlargement of device chip size, thereby decreasing the production yield. During the operation of read or write, semiconductor memory devices are precharging all bit line pairs in the same block. Therefore, as data from or into a memory cell in a redundant column are read out or written, bit line pairs connected with defective normal memory cell, i.e., defective normal column in the same block are precharged, thereby giving the result of power dissipation.

THE SUMMARY OF THE INVENTION

The object of the present invention is to provide a semiconductor memory device including a plurality of normal blocks containing only normal memory cells without a redundant memory cell and a redundant block containing only redundant memory cells.

Another object of the present invention is to provide a semiconductor memory device being capable of not only replacement of defective columns in normal blocks with columns in the redundant block but also the replacement of one of normal blocks with the redundant block.

Still another object of the present invention is to provide a semiconductor memory device which performs column redundancy capable of decreasing power consumption.

Still more another object of the present invention is to provide a semiconductor memory device which may reduce the chip size in column redundancy thereof.

To achieve the above described objects and other advantages, the present invention provides a semiconductor memory device comprising a plurality of normal blocks each having a plurality of normal row and column lines each connected with a plurality of normal memory cells; a redundant block having a plurality of redundant row and column lines each connected with a plurality of redundant memory cells; block decoder for selecting one of the normal blocks in response to first address signals; a redundant column decoder being programmed to select redundant columns replacing normal columns which are containing defective normal memory cells according to the output signals of the block decoder and second address signals, the decoder producing redundant operation signals when a defective normal memory cell is addressed; a redundant clock generator for producing a redundant control clock in response to the redundant operation signals; and a plurality of normal column decoders associated with the normal columns in the respective normal blocks, whereby the decoders all are disabled by the redundant control clock when a defective normal memory cell is addressed, and one of the decoders is enabled by the output signals of the block decoder for selecting a normal column line addressed by the second address signals when a defect-free normal memory cell is addressed.

The present invention also includes a redundant precharge circuit connected to the redundant column lines and a plurality of normal precharge circuits connected to the normal column lines in the respective normal block. When a defective normal cell is addressed, all of the normal precharge circuits are disabled in a response to the redundant control clock. But, when a defect-free normal cell is addressed, only the normal precharge circuit in normal block containing the defect-free normal cell is enabled. Redundant sense amplifiers associated with redundant column lines and normal sense amplifiers associated with normal column lines in the respective normal blocks also operate in the same manner as the redundant and normal precharge circuits.

BRIEF DESCRIPTION OF THE DRAWINGS

The present invention will be more clearly understood from the description as set forth below with reference to the accompanying drawings, wherein.

DETAILED DESCRIPTION OF THE PRESENT INVENTION

Hereinafter, the preferred embodiment of the present invention will be explained in detail with reference to the accompanying drawings.

Figure 1:
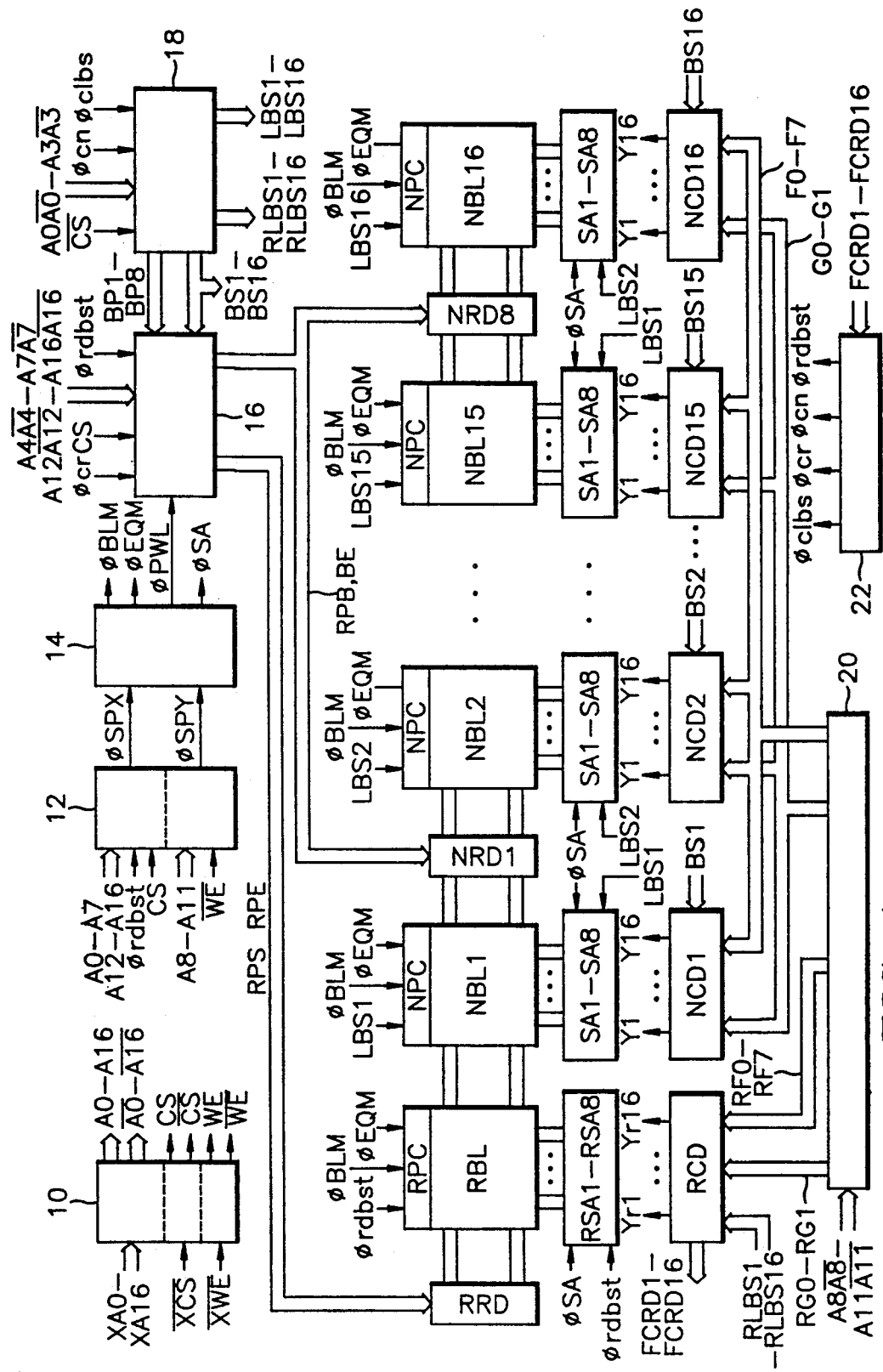
FIG. 1 is a block diagram of a semiconductor memory device according to the present invention.
Figure 2:
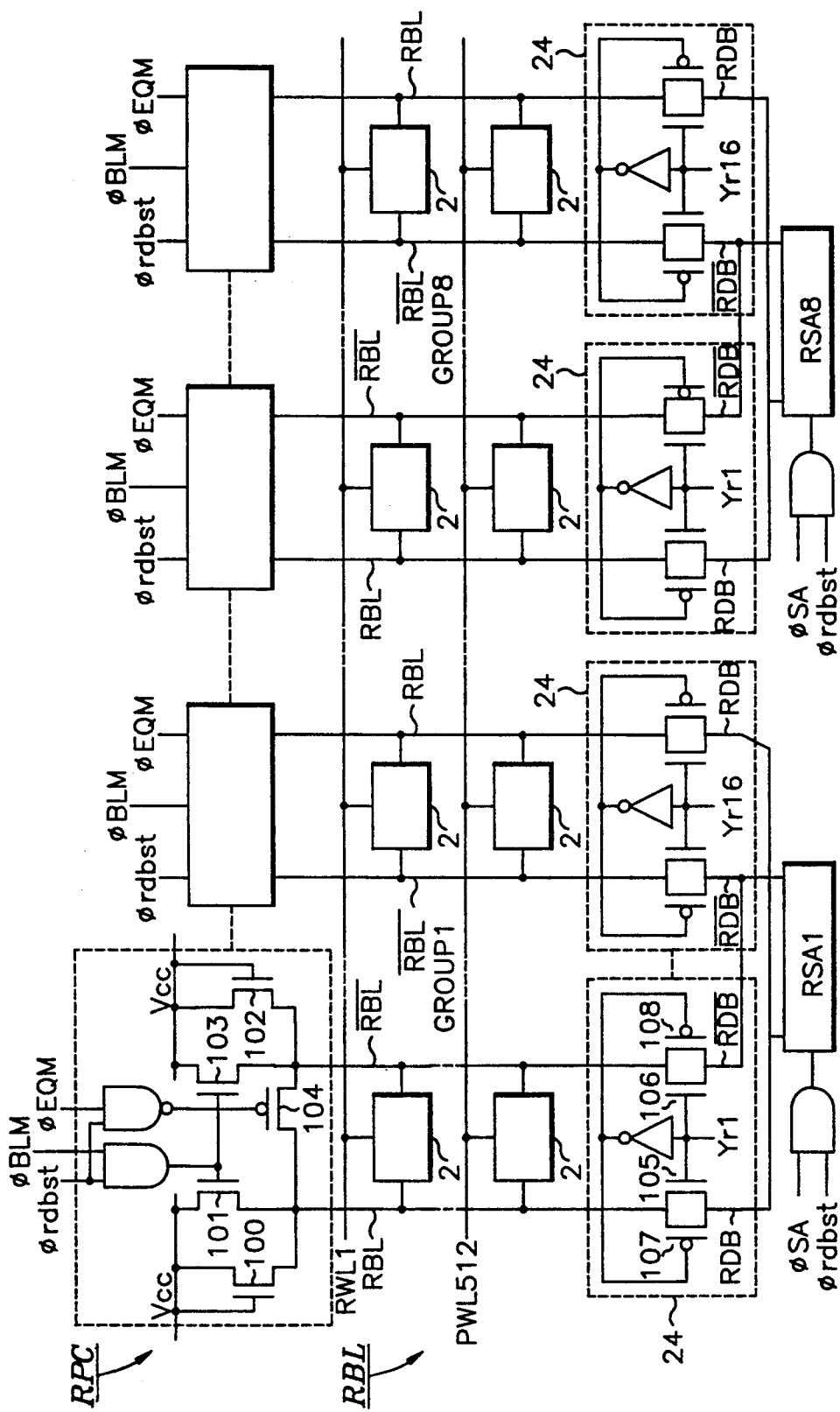
FIG. 2 is a schematic circuit diagram of a redundant block having redundant memory cell arrays of eight groups and its peripheral circuitry.
Figure 3:
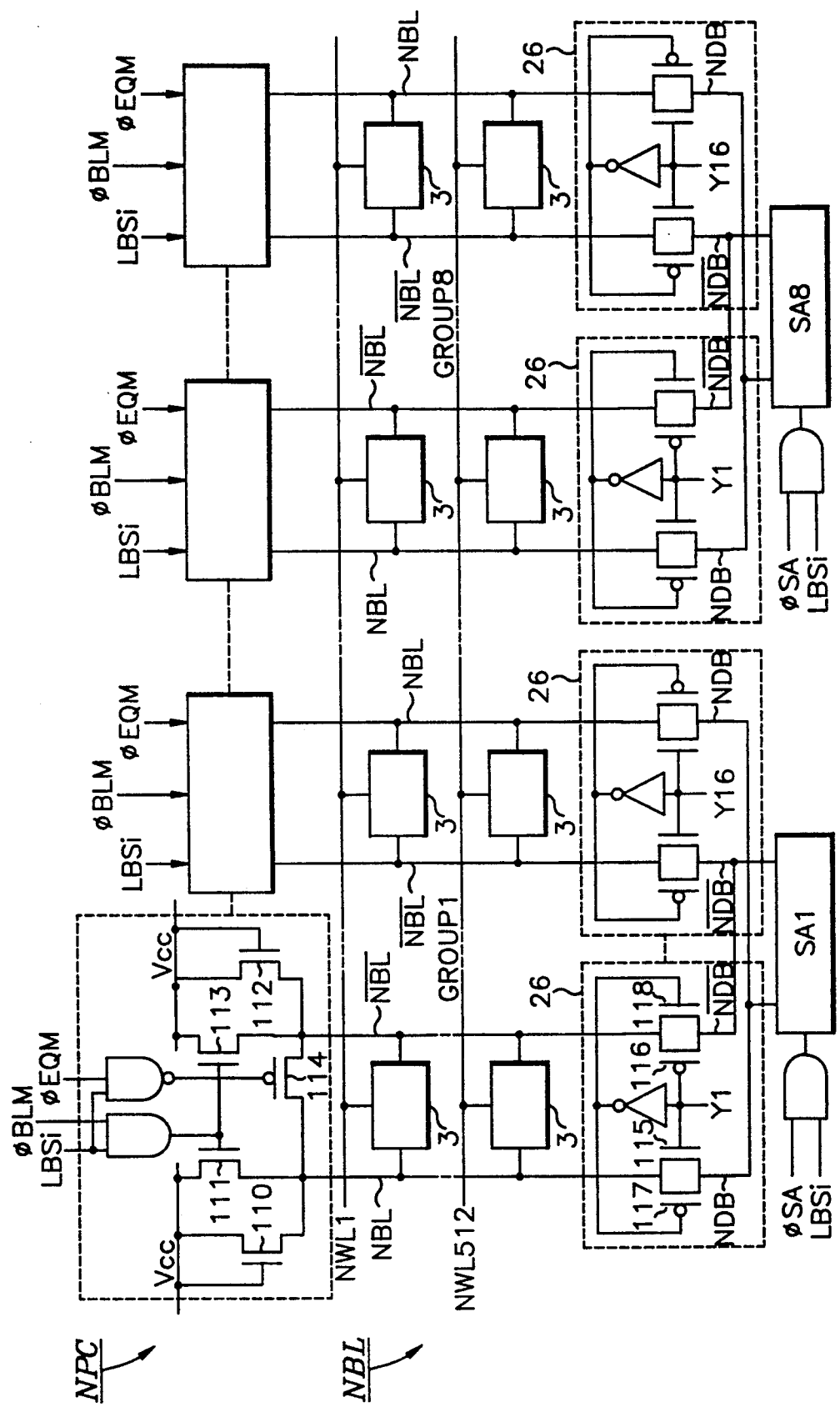
FIG. 3 is a schematic circuit diagram of a normal block having normal memory cell arrays of eight groups and its peripheral circuitry.

FIG. 1 is showing a block diagram of 1-Mega-bit static semiconductor memory (SRAM) device according to the present invention. FIG. 2 is a circuit diagram showing a redundant block with redundant memory cells, a redundant precharge circuit and redundant sense amplifiers and FIG. 3 is a circuit diagram of showing a normal block with normal memory cells, a normal precharge circuit and normal sense amplifiers.

Referring to the above drawings, 1-Mega-bit memory array of SRAM is divided into one redundant block RBL and 16 normal blocks NBL1 to NBL16. Memory cells in the respective blocks are arranged in a matrix form of 512 rows and 128 columns. In the redundant block RBL, 512 redundant memory cells 2 in each of the same columns are connected between redundant bit line pair RBL, $\overline{RBL}$ and 128 redundant memory cells in the same rows are respectively connected to redundant word (or row) lines RWL1-RWL512. A redundant precharge circuit RPC for precharging and equalizing the redundant bit line pairs upon selection of the redundant block RBL is coupled to the upper terminals of the redundant bit line pairs (RBL, $\overline{RBL}$). Lower terminals of the redundant bit line pairs are respectively connected to redundant data bit line pairs (RDB, $\overline{RDB}$) via pass gates 24 which are composed of pass transistors 105 to 108. Redundant data bit line pairs respectively connected with 128 redundant bit line pairs are divided into eight groups each having sixteen redundant data bit line pairs, and redundant data bit line pairs (RDB, $\overline{RDB}$) in the respective groups are respectively connected to redundant sense amplifiers RSA1 to RSA8 for sensing data stored in a selected redundant memory cell in the redundant block RBL in a read operation thereof.

Each of the normal blocks NBL1 to NBL16 includes normal memory cells 3, normal bit line pairs (NBL, $\overline{NBL}$) and normal row (or word) lines NWL1 to NWL512 in the same connection and array relation as those of the redundant block RBL. A normal precharge circuit NPC for precharging and equalizing, upon selection of one of the normal blocks, normal bit line pairs (NBL, $\overline{NBL}$) in the selected normal block is connected to the upper terminals of normal bit line pairs (NBL, $\overline{NBL}$). Lower terminals of the normal bit line pairs are connected to normal data bit line pairs (NDB, $\overline{NDB}$) via normal pass gates 26 which are composed of pass transistors 115 to 118. 128 normal bit line pairs in the respective normal blocks are divided into eight groups each having sixteen normal bit line pairs, and normal data bit line pairs in the respective groups are respectively connected to normal sense amplifiers SA1 to SA8 for sensing data stored in a selected normal memory cell in a selected one of the normal blocks in a read operation thereof.

At the left side of the redundant block RBL is disposed a redundant row decoder RRD for selecting one of the redundant row (or word) lines RWL1 to RWL512, and normal row decoders NRD1 to NRD8 for selecting one of normal row lines NWL1 to NWL512 in the left or right side normal block are respectively located between normal block pairs (NBL1, NBL2) to (NBL15, NBL16). At the lower portion of the redundant block RBL and normal blocks NRD1 to NRD8 are respectively located a redundant column decoder RCD and normal column decoders NCD1 to NCD16 for selecting one of pass gates 24 or 26 in the respective groups in the corresponding block.

A buffer 10 is a conventional circuit for converting external signals of TTL level to internal signals of CMOS level. The buffer 10 includes an address buffer for converting external address signals XA0 to XA16 to internal address signals $\overline{A0}$ to $\overline{A16}$ and their complements A0 to A16, a chip selection buffer for converting external chip-select signal $\overline{XCS}$ to internal chip-select signal CS and its complement $\overline{CS}$ and a write enable buffer for converting external write enable signal $\overline{XWE}$ to internal write enable signal WE. The address signals A0 to A3 will be used as signals for selecting one of the normal blocks, the address signals A4 to A7 and A12 to A16 as those for selecting one of normal or redundant word lines and the address signals A8 to A11 as those for selecting one of normal or redundant column lines.

A transition detector 12 functions to generate short pulses $\phi SPX$ in response to the address signals A0 to A7, A12 to A16, the chip-select signal CS and a third redundant control signal $\phi rdbst$ from a redundant clock generator 22 as will be explained hereinafter, and short pulses $\phi SPY$ in response to the address signals A8 to A11 and the write enable signal WE. The transition detector 12 includes address transition detectors for detecting bi-directional transition of logic states, i.e., transition of as well as from low state to high state and from high state to low state, for the respective address signals A0 to A16; a redundant clock transition detector for detecting bi-directional transition of the third redundant control signal $\phi rdbst$; chip selection and write enable transition detectors for detecting one directional transition of logic states, i.e., transition from low state to high state, for respective one of the chip selection signal CS and the write enable signal $\overline{WE}$; a first summation generator for summing respective output signals of the address transition detectors for address signals A0 to A7 and A12 to A16, the redundant clock transition detector and the chip-select transition detector; and a second summation generator for summing respective output signals of the address transition detectors for address signals A8 to A11 and the write enable transition detector. The transition detectors and the summation generators are known in the art. Therefore, signal transition of any one of the address signals A0 to A7 and A12 to A16, the third redundant control signal $\phi rdbst$ and the chip-select signal CS renders the pulse $\phi SPX$ to a short pulse of low state. In the same manner, signal transition of any one of the address signals A8 to A11 and the write enable signal $\overline{WE}$ renders the pulse $\phi SPY$ to a short pulse of low state.

A main clock generator 14 generates timing clock signals $\phi BLM$, $\phi EOM$, $\phi PWL$ and $\phi SA$ for controlling the operation of SRAM device in response to the pulses $\phi SPX$ and $\phi SPY$. The clock signals $\phi BLM$ and $\phi E0M$ are respectively signals for precharging and equalizing normal or redundant bit line pairs, the timing clock signal $\phi PWL$ for enabling word lines in the respective blocks, $\phi SA$ for activating sense amplifiers.

Figure 4:
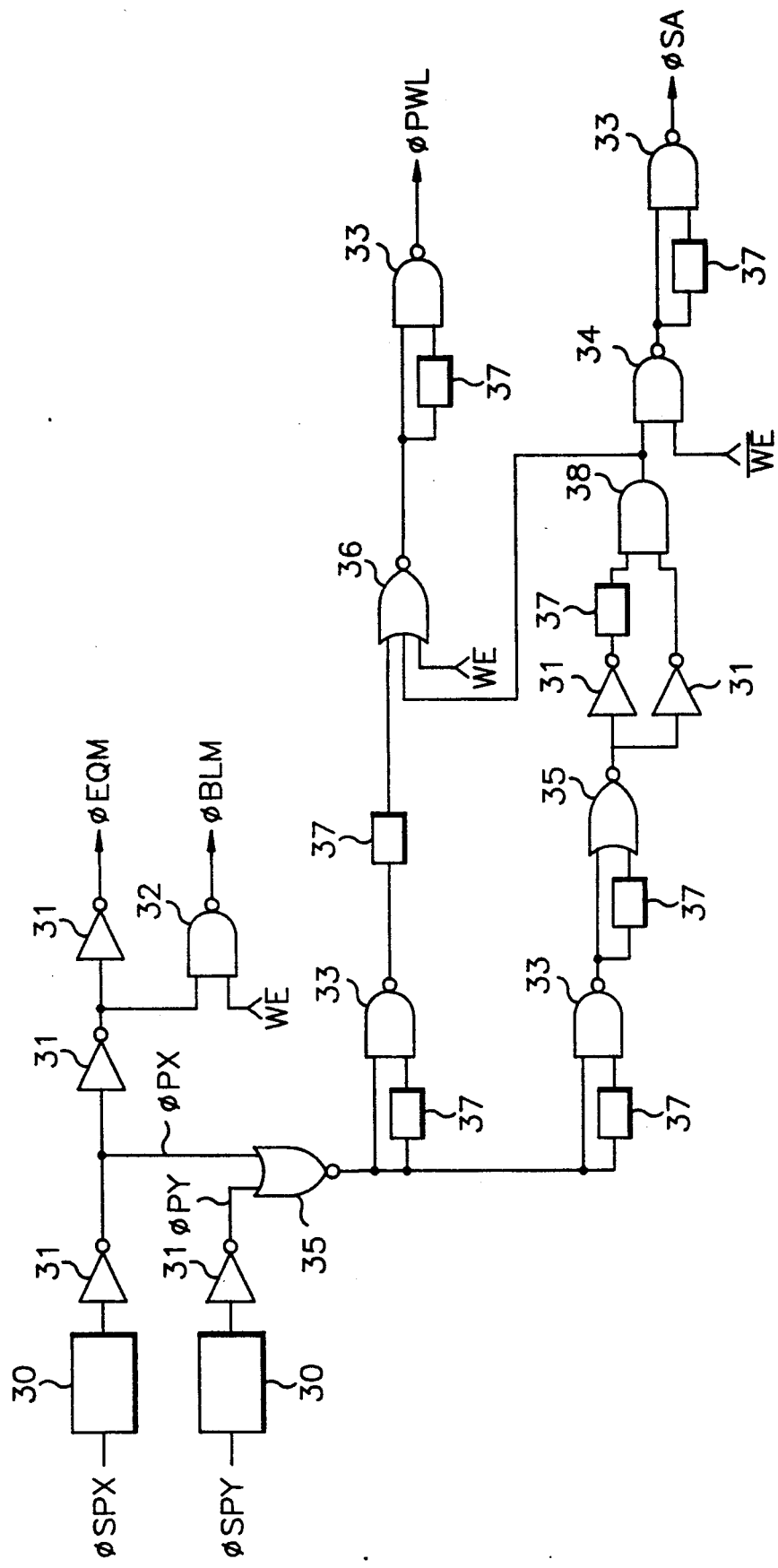
FIG. 4 is a logic circuit diagram of a main clock generator in FIG. 1.

FIG. 4 is showing a schematic circuit diagram of the main clock generator 14 which includes pulse-width expanding circuits 30 inverter 31, delay circuits 37, NAND gates 32 to 34, NOR gates 35 and 36 and an AND gate 38. The pulse-width expanding circuit 30 functions to expand the pulse $\phi$SPX or $\phi$SPY having short pulse width to a predetermined pulse-width so as to apply or use in the present system. The precharging clock signal $\phi$BLM is enabled to a high state by the NAND gate 32 inputting the write enable signal WE of low state upon a read time, and is enabled to a high state upon a write time in response to the pulse $\phi$SPX. The equalizing clock signal $\phi$EOM is enabled to a high state in response to the pulse $\phi$SPX upon a read or write time. The word line selecting clock signal $\phi$PWL is enabled to a high state via the NOR gate 36 by the signal WE of high state upon a write time and is enabled to a high state in response to the pulse $\phi$SPX or $\phi$SPY upon a write time. The sense amplifier activating clock signal $\phi$SA is enabled to a high state upon a read time in response to the signal $\overline{WE}$ of high state and the pulse $\phi$SPX or $\phi$SPY is disabled to a low state upon a write time by the NAND gate 34 receiving the signal $\overline{WE}$ of low state.

A block decoder 18 decodes block selecting address signals A0 to A3 and their complements $\overline{A0}$ to $\overline{A3}$, thereby generating normal block pair selecting signals BP1 to BP8 for selecting one of the normal block pairs (NBL1, NBL2) to (NBL15, NBL16) and block selecting signals RLBS1 to RLBS16 for selecting one of the normal blocks NBL1 to NBL16. The block decoder 18 includes means for producing normal row and column decoder selecting signals BS1 to BS16 for disabling or selectively enabling the normal row and column decoders NRD1 to NRD8 and NCD1 to NCD16 in response to a first redundant control signal $\phi$Cn from the redundant clock generator 22 and the block selecting signals RLBS1 to RLBS16, and means for producing normal precharge circuit and sense amplifier selecting signals LBS1 to LBS16 for disabling or selectively enabling normal precharge circuits NPC and normal sense amplifiers SA1 to SA8 in response to a second redundant control signal $\phi$clbs from the redundant clock generator 22 and the signals RLBS1 to RLBS16.

Figure 5:
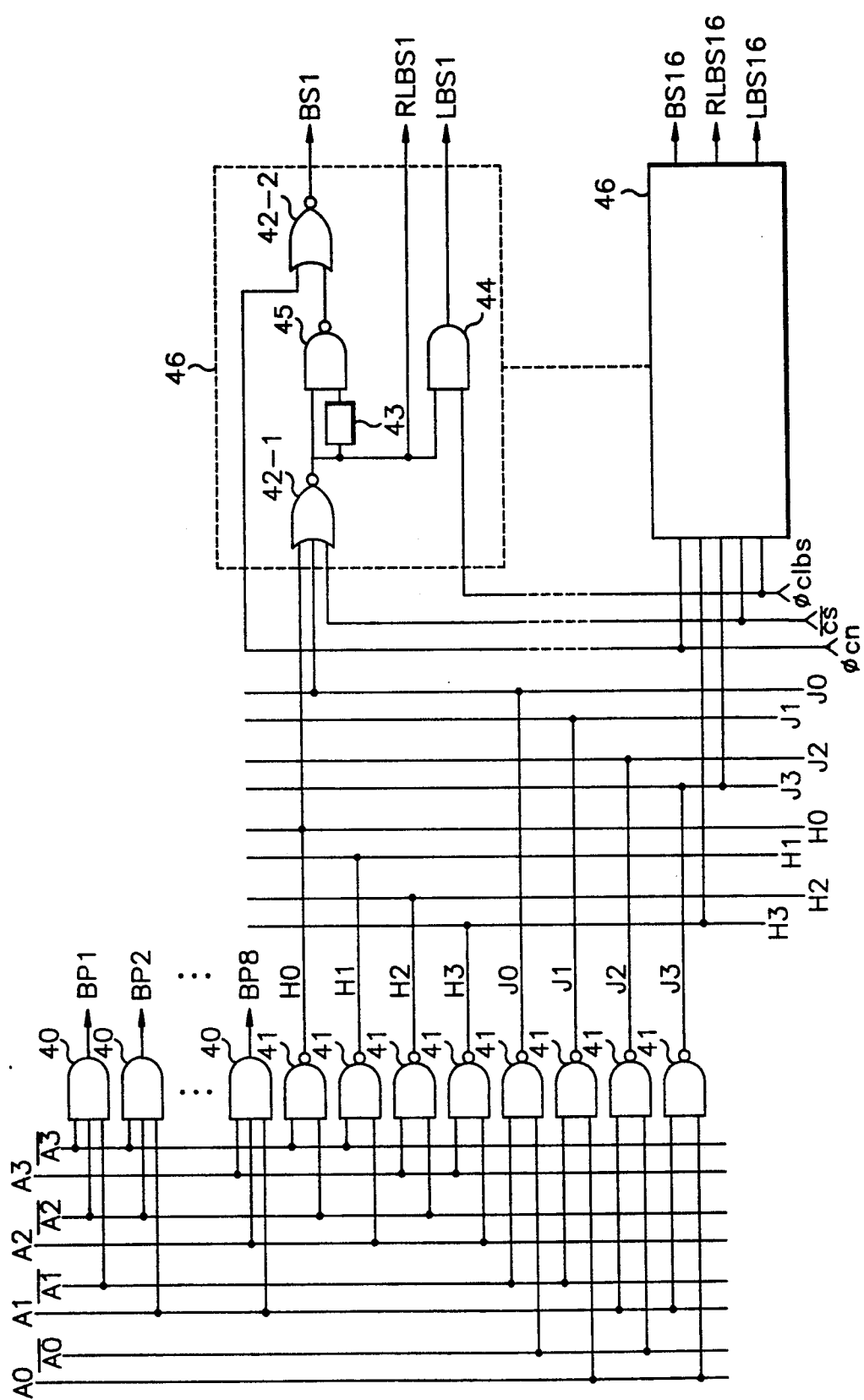
FIG. 5 is a logic circuit diagram of a block decoder in FIG. 1.

FIG. 5 is illustrating a circuit diagram of the block decoder which includes AND gates 40 and 44, NAND gates 41 and 45, NOR gates 42.1, 42.2 and a delay circuit 43. The normal block pair selecting signals BP1 to BP8 are produced by decoding the address signals A1 and $\overline{A1}$ to A3 and $\overline{A3}$ from the address buffer via AND gates 40. Blocks 46 all have the same construction. The block selecting signals RLBS1 to RLBS16 are produced by portions having NAND gates 41 and NOR gates 42-1. The signals RLBS1 to RLBS16 are respectively output at the NOR gates 42-1 upon receipt of address signals and the chip-select signal $\overline{CS}$ at a low state. Portions having the delay circuit 43, the NAND gates 45 and the NOR gate 42-2 in the respective blocks 46 respectively produce the signals BS1 to BS16 in response to the signals RLBS1 to RLBS16 and $\phi$cn. AND gates 44 in the blocks 46 respectively produce the signal LBS1 to LBS16 in response to the signals RLBS1 to RLBS16. When the chip selection signal $\overline{CS}$ and input address signals are supplied, NAND gates 41 and NOR gates 42-1 renders one of the block selecting signals RLBS1 to RLBS16 supplied to a redundant column decoder RCD to a high state. At this time, if said address signals are to designate a defective normal memory cell, the clock signals $\phi$rdbst and $\phi$clbs from the redundant clock generator 22 respectively go to a high state and a low state as will be discussed hereinafter, and then all the signals BS1 to BS16 and LBS1 to LBS16 go to low states so as to disable all of the normal row and column decoders and normal sense amplifiers. On the other hand, if address signals are to address a defect-free normal memory cell, the clock signals $\phi$rdbst and $\phi$clbs respectively become a low state and a high state, and then NOR gates 42-2 provide signals BS1 to BS16 enabling a normal row and AND gates 44 provide column decoder associated with the selected normal block corresponding to the normal memory cell addressed by the address signals and signals LBS1 to LBS16 enabling a normal precharge circuit and normal sense amplifiers associated with the selected normal block.

A row predecoder 16 predecodes the row address signals, (A4, $\overline{A4}$) to (A7, $\overline{A7}$) and (A12, $\overline{A12}$) to (A16, $\overline{A16}$) from the address buffer under the control of the signals BP1 to BP8 and BS1 to BS16, the word line selecting clock signal $\phi$PWL, the chip-select signal CS, the third redundant control signal $\phi$rdbst and a fourth redundant control signal $\phi$cr, and generates normal row predecoding signals RPB and BE and redundant row predecoding signals RPS and RPE.

Figure 6:
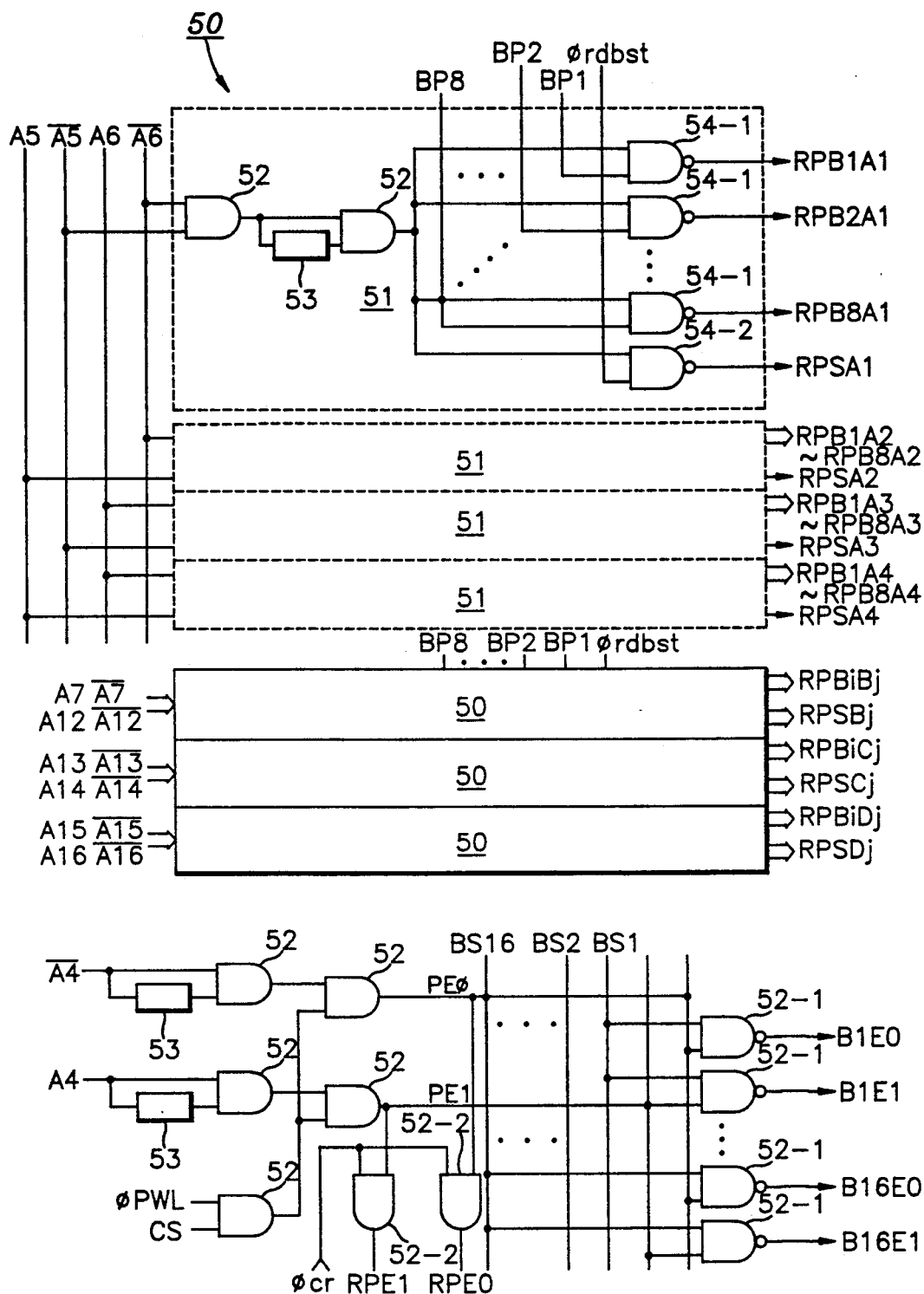
FIG. 6 is a logic circuit diagram of a row predecoder in FIG. 1.

FIG. 6 is showing a circuit diagram of the row predecoder 16 in which the same elements or parts are using the same reference numerals. Reference numeral 52 represents a AND gate and reference numerals 53 and 54 respectively a delay circuit and a NAND gate. The signals RPB represents signals RPBiAj, RPBiBj, RPBiCj and RPBiDj, the signals BE signals BiE0 and BiE1, the signals RPS signals RPSAj, RPSBj, RPSCj and RPSDj, and the signals RPE signals RPE0 and RPE1, wherein i is an integer number of 1 to 8, j is that of 1 to 4 and k is that of 1 to 16. The signals RPB from NAND gates 54-1 are predecoding signals for selecting normal word lines in one of the normal block pairs. For example, to select normal word lines in the first normal block pair (NBL1, NBL2), signals RPB1A1 to RPB1A4, RPB1B1 to RPB1B4, RPB1C1 to RPB1C4 and RPB1D1 to RPB1D4 are supplied to the normal row decoder NRD1. The signals BE from AND gates 52-1 are predecoding signals for selecting one of the normal word lines. However, if a defective normal memory cell is designated by input address signals, all of the signals BE go to low states by signals BS1 to BS16 which are all at low states, thereby disabling all normal decoders NRD1 to NRD8. On the other hand, if a defect-free normal memory cell in the i-th normal block NBLi were designated by input address signals, one of normal word line selecting signals BiE0 and BiE1 goes to a high state by the signals $\phi$PWL, CS and BSi which are all at high states. The signals RPS from NAND gates 54-2 are coupled to the redundant row decoder RRD in order to select a pair of redundant word lines under the control of the signal $\phi$rdbst which goes to a high state during a redundant column replacing operation, and the signals RPE from AND gates 52-2 are coupled to the redundant row decoder RRD in order to select one redundant word line of the selected redundant word line pair. If a normal memory cell designated by input address signals were not defective, the signals RPS and RPE all go to high states with signals $\phi$rdbst and $\phi$cr of low states, thereby the redundant row decoder RRD is disabled.

Figure 7A:
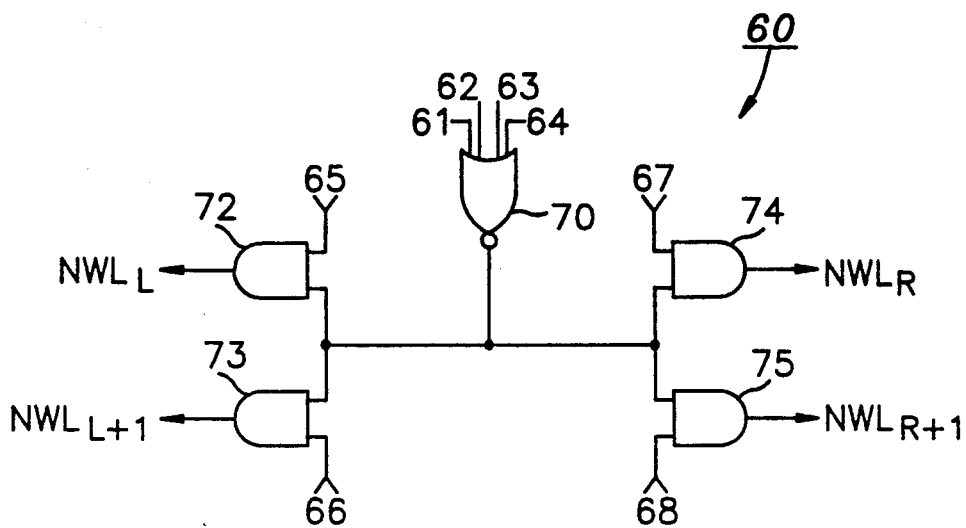
FIG. 7A and FIG. 7B are respectively logic circuit diagrams of a normal row decoder and a redundant row decoder in FIG. 1.

FIG. 7A is a circuit diagram of a basic decoder used in the respective normal row decoders NRD1 to NRD 8. Each of the normal row decoders has 256 decoders. The decoder 60 is composed of a NOR gate 70 and AND gates 72 to 75. When the decoder 60 is employed in the normal row decoder NRD3, input terminals 61 to 64 of the NOR gate 70 are respectively connected to one of signals RPB3A1 to RPB3A4, one of signals RPB3B1 to RPB3B4, one of signals RPB3C1 to RPB3C4 and one of signals RPB3D1 to RPB3D4. When these input signals are all low states, normal word line pairs (NWLL, NWLL+1) in the normal block NBL5 and normal word line pairs (NWLR, NWLR+1) in the normal block NBL6 may be selected. At the same time, other input terminals 65 and 66 of AND gates 72 and 73 are respectively coupled to signals B5E0 and B5E1 and other input terminals 67 and 68 of AND gates 74 and 75 are respectively coupled to signals B6E0 and B6E1, thereby selecting one normal word line of the normal word line pair in one block of the normal blocks NBL5 and NBL6.

Figure 7B:
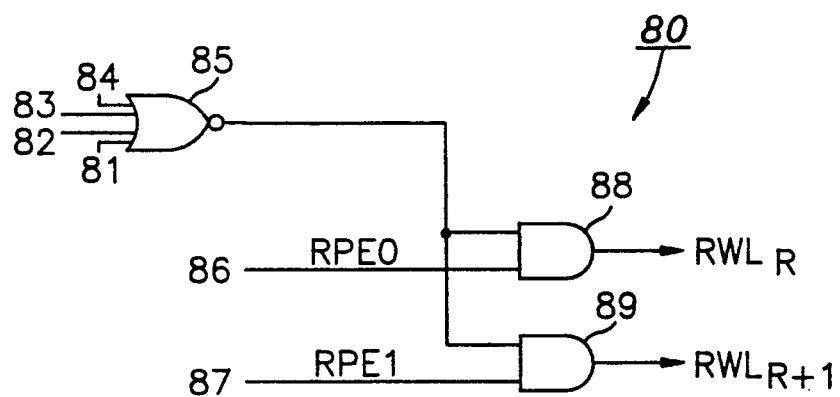

FIG. 7B is a circuit diagram of a basic decoder 80 employed in the redundant row decoder RRD which includes a NOR gate 85 and AND gates 88 to 89. The redundant row decoder RRD has 256 decoders. Input terminals 81 to 84 of the NOR gate 85 are respectively coupled to one of RPSD1 to RPSA4, one of RPSB1 to RPSB4, one of RPSC1 to RPSC4 and one of RPSD1 to RPSD4, and its output is coupled to one input terminal of each of AND gates 88 and 89. Input terminals 86 and 87 of AND gates 88 and 89 respectively receive the signals RPE0 and RPE1 from AND gates 52-2 in FIG. 6. Therefore, since the signal $\phi cr$ goes to a high state and then one of signals PE0 and PE1 goes to a high state during the redundant column replacing operation, one of redundant word lines RWLR and RWLR+1 may be selected with the output of the NOR gate 85. On the other hand, in a normal operation mode unselecting the redundant block, since the signals RPE0 and RPE1 are all low states, the redundant row decoder RRD may not select redundant word lines.

A column predecoder 20 predecodes the column address signals (A8, A8) to (A11, A11) from the address buffer, thereby producing redundant column predecoding signals RG0, RG1 and RF0 to RF7 supplied to the redundant column decoder RCD and normal column predecoding signals G0, G1 and F0 to F7 to the normal column decoders NCD1 to NCD16.

Figure 8:
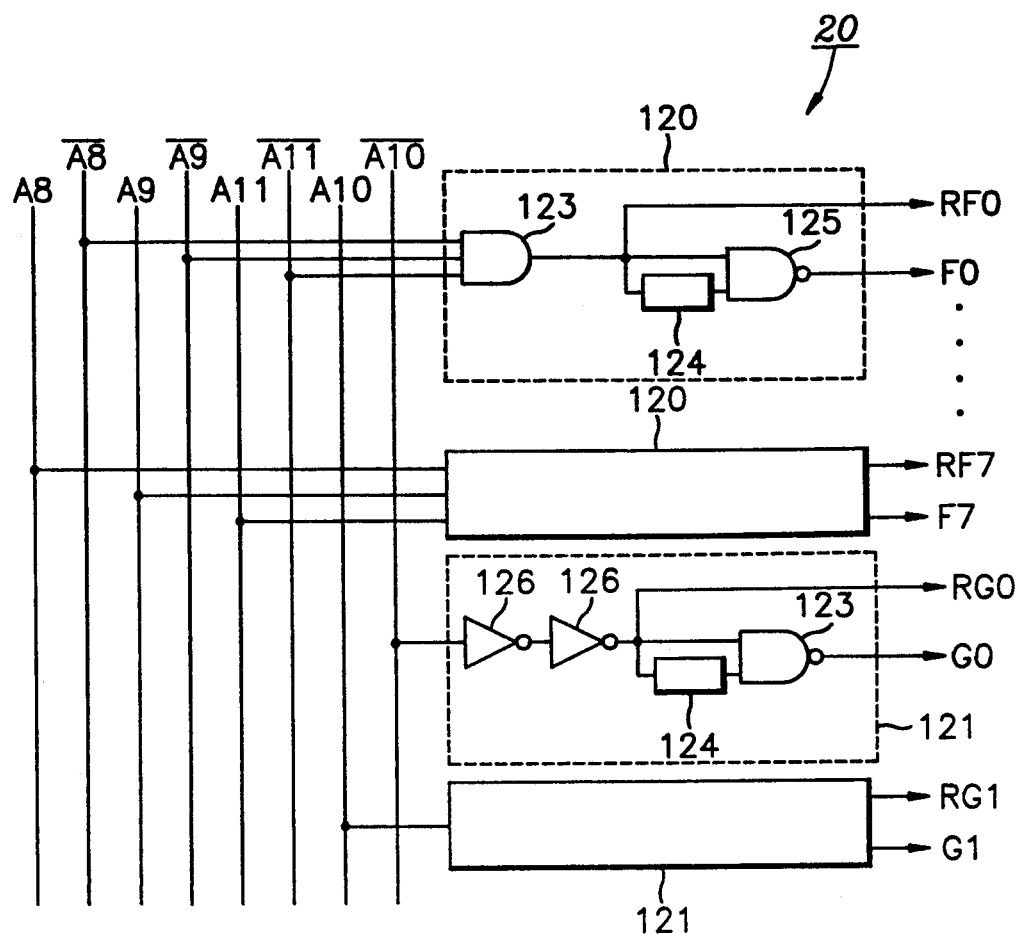
FIG. 8 is a logic circuit diagram of a column predecoder in FIG. 1.

Referring to FIG. 8, the column predecoder 20 generates the signals RF0 to RF7 and F0 to F7 by decoding the column address signals A8, A9 and A11 and their complements, and produces the signals RG0, RG1, G0 and G1 with the address signal A10 and its complement. In the drawing, the same reference numerals stand for the same elements or parts. Reference numerals 123 to 126 represent AND gates, delay circuits, NAND gate and inverters respectively.

Figure 9A:
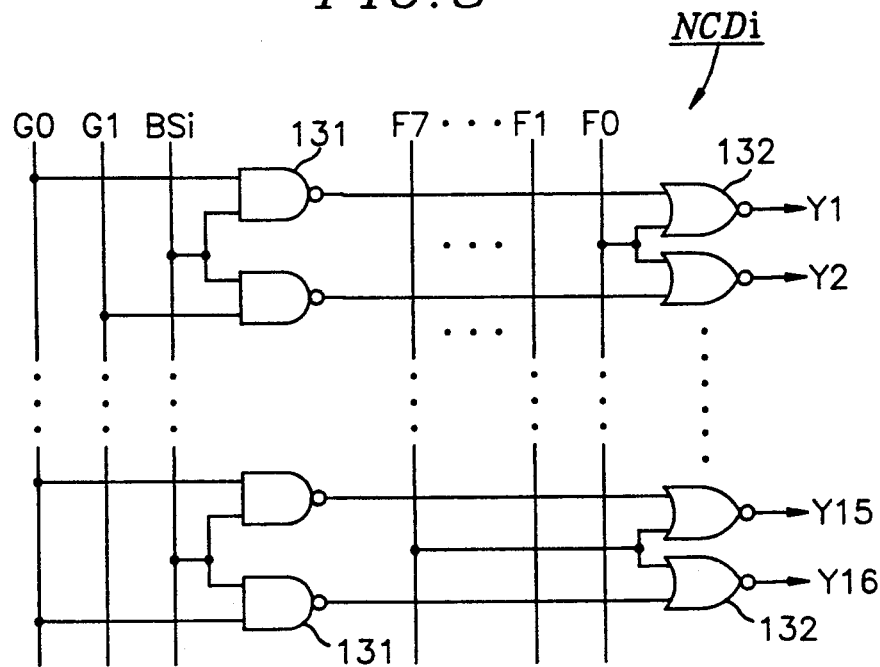
FIG. 9A and FIG. 9B are respectively logic circuit diagrams of a normal column decoder and a redundant column decoder in FIG. 1.

Referring to FIG. 9A, the normal column decoder NCDi associated with the i-th normal block NBLi is illustrated, which is composed of NAND gates 131 and NOR gates 132. The normal column decoder NCDi is activated or enabled by the normal row and column decoder selecting signal BSi and renders one of normal column selecting signals Y1 to Y16 to a high state with the normal column predecoding signals G0, G1 and F0 to F7. As shown in FIG. 3, the signals Y1 to Y16 are respectively coupled to gates of pass transistors 115 and 116 which are connected between normal bit line pairs (NBL, $\overline{\text{NBL}}$) and normal data bit line pairs (NDB, $\overline{\text{NDB}}$) in each of eight groups in the normal block NBLi.

The redundant column decoder RCD, when programmed so as to substitute defective normal columns with redundant columns, decodes the redundant column predecoding signals RF0 to RF7, RG0 and RG1 from the column predecoder 20 and the block selecting signals RLBS1 to RLBS16 from the block decoder 18, for generating redundant column selecting signals Yr1 to Yr16 for selecting redundant columns in the redundant block RBL and redundant operation signals FCRD1 to FCRD16 supplied to the redundant clock generator 22. As is indicated by FIG. 2, column selecting signals Yr1 to Yr16 are respectively coupled to gates of pass transistors 105 and 106 whose drains are connected with the respective redundant bit line pairs (RBL, $\overline{\text{RBL}}$) in each of eight groups of redundant memory arrays as shown in FIG. 2.

Figure 9B:
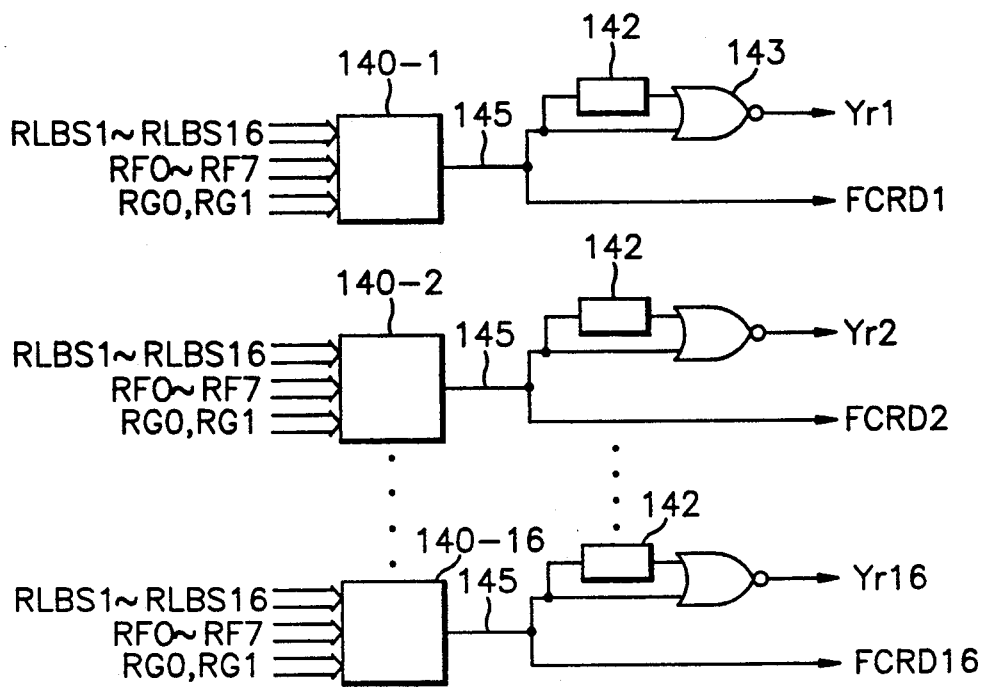
Figure 10:
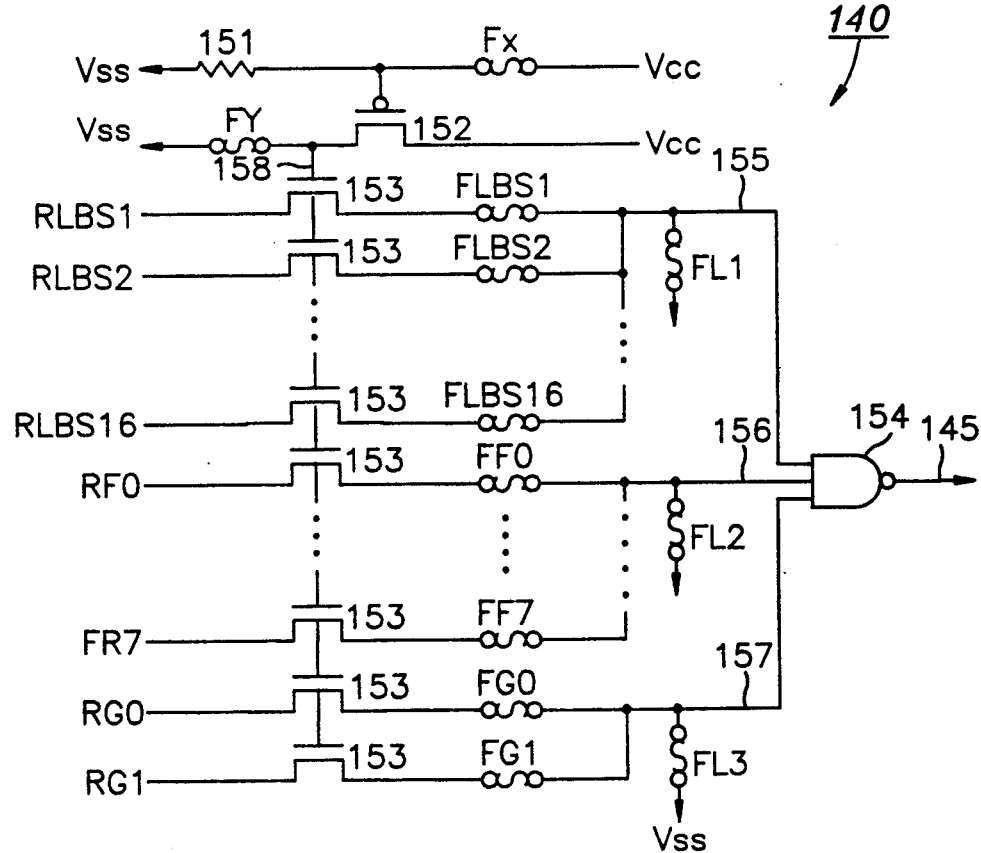
FIG. 10 is a schematic circuit diagram of a redundant program device in FIG. 9B.

FIG. 9B shows a logic circuit diagram of the redundant column decoder RCD. In the drawing, reference numerals 140-1 to 140-16 stand for redundant column program devices for programming to replace one selected defective normal block or normal columns corresponding to defective normal memory cells in normal blocks. The redundant column program devices 140-1 to 140-16 generate the redundant operation signals FCRD1 to FCRD16 via output lines 145 and produce redundant column selecting signals Yr1 to Yr16 via delay circuits 142 and NOR gates 143. Each of the column program devices 140-1 to 140-16 has the same construction as redundant column program device 140 as shown in FIG. 10. The redundant column program device 140 is composed of a p-channel MOS FET transistor 152, n-channel MOS FET transistors 153, fuses FX, FY, FLBS1 to FLBS16, FF0 to FF7, FG0, FG1 and FL1 to FL3 of polycrystalline silicon, and a NAND gate 154. Reference numeral 145 stands for an output line of the NAND gate 154. The block selecting signals RLBS1 to RLBS16 and the redundant column selecting signals RF0 to RF7, RG0 and RG1 are respectively connected to the one end terminals fuses FLBS1 to FLBS16, FF0 to FF7, FG0 and FG1 via drain-source paths of the transistors 153. The other end terminals of fuses FLBS1 to FLBS16 are in common connected to a first input line 155. In the same manner, the other end terminals of the fuses FF0 to FF7 and the fuses FG0 and FG1 are in common connected respectively to a second input line 156 and a third input line 157 of the NAND gate 154. The fuses FL1 to FL3 are respectively connected between the first, second and third input lines 155 to 157 and the reference potential Vss (ground potential). The gates of the transistors 153 are connected to a common gate line 158 which is connected to the drain of the transistor 152. The source of transistor 152 is coupled to the power supply potential Vcc and the fuse FY is connected between the drain of transistor 152 and the reference potential Vss. The gate of transistor 152 is connected with the connection node of a resistor 151 and the fuse Fx connected in series between the power supply potential Vcc and the reference potential Vss.

As the result of test after the fabrication of the SRAM device, when none of normal memory cells in the normal blocks NBL1 to NBL16 are determined to be defective, there will be no blowing or cutting by a laser beam of any fuses in the redundant column program devices 140-1 to 140-16. Then, all of the transistors 153 in the respective program devices are turned off. Since all input signals of the NAND gate 154 keep at low states via fuses FL1 to FL3, all output lines 145 of the program devices 140-1 to 140-16 hold at high states. Therefore, the redundant operation signals FCRD1 to FCRD16 are all at high states and the redundant column selecting signals Yr1 to Yr16 are all at low states so as not to select redundant columns. On the contrary, when normal memory cells are determined to be defective, the programming for replacing the defective normal memory cells with redundant memory cells can be performed. The programming may be performed by blowing predetermined fuses in the redundant column program devices 140-1 to 140-16. According to the feature of the present invention, the present device may perform the replacement of any one of the normal blocks NBL1 to NBL16 with the redundant block RBL as well as normal columns containing defective normal memory cells in the normal blocks with redundant columns in the redundant block. When all defective memory cells are limited to only one normal block, the substitution of this normal block with the redundant block RBL may be achieved by blowing master fuses FX, FY and FL1 to FL3 in the redundant column program devices 140-1 to 140-16 and fusing column selecting fuses so as to produce redundant column selecting signals Yr1 to Yr16. For example, to replace the normal block NBL1 with the redundant block RBL, master fuses FX, FY and FL1 to FL3 and block selecting fuses FLBS2 to FLBS16 in the respective redundant column program devices are blown by the laser beam. At the same time, selected fuses of column selecting fuses FF0 to FF7, FG0 and FG1 in the respective redundant column program devices are blown. That is, the redundant column selecting program is performed in such a manner that column selecting fuses FF1 to FF7 and FG1 in the program device 140-1 are blown to generate the redundant column selecting signal Yr1 corresponding to the normal column selecting signal Y1, and then fuses FF1 to FF7 and FG0 in the program device 140-2 are blown to generate the signal Yr2 corresponding to the signal Y2 and so on.

Now, discussion will be made about the programming for replacing normal columns containing defective memory cells in normal blocks. For the ease of discussion, the replacement of the first normal column in the first normal block NBL1 and the sixteenth normal column in the second normal block NBL2 will be discussed. To replace the first normal column in the normal block NBL1, master fuses FX, FY and FL1 to FL3, block selecting fuses FLBS2 to FLBS16 and column selecting fuses FF1 to FF7 and FG1 in the program device 140-1 are melted by the laser beam and, to replace the sixteenth normal column in the normal block NBL2, master fuses FX, FY and FL1 to FL3, block selecting fuses FLBS1 and FLBS3 to FLBS15 and column selecting fuses FF0 to FF6 and FG0 are melted in program device 140-2. There is no blowing of fuses in the remaining program devices 140-3 to 140-16. Therefore, if address signals selecting the first normal column in the normal block NBL1 are inputed, the output line 145 of the program device 140-1 goes to a low state and output lines 145 of the program devices 140-2 to 140-16 all goes to high states, thereby rendering the redundant column selecting signal Yr1 to a high state and the signals Yr2 to Yr16 to low states. Therefore, the column redundancy scheme of the embodiment of the present invention may replace up to maximum sixteen normal columns.

Figure 11:
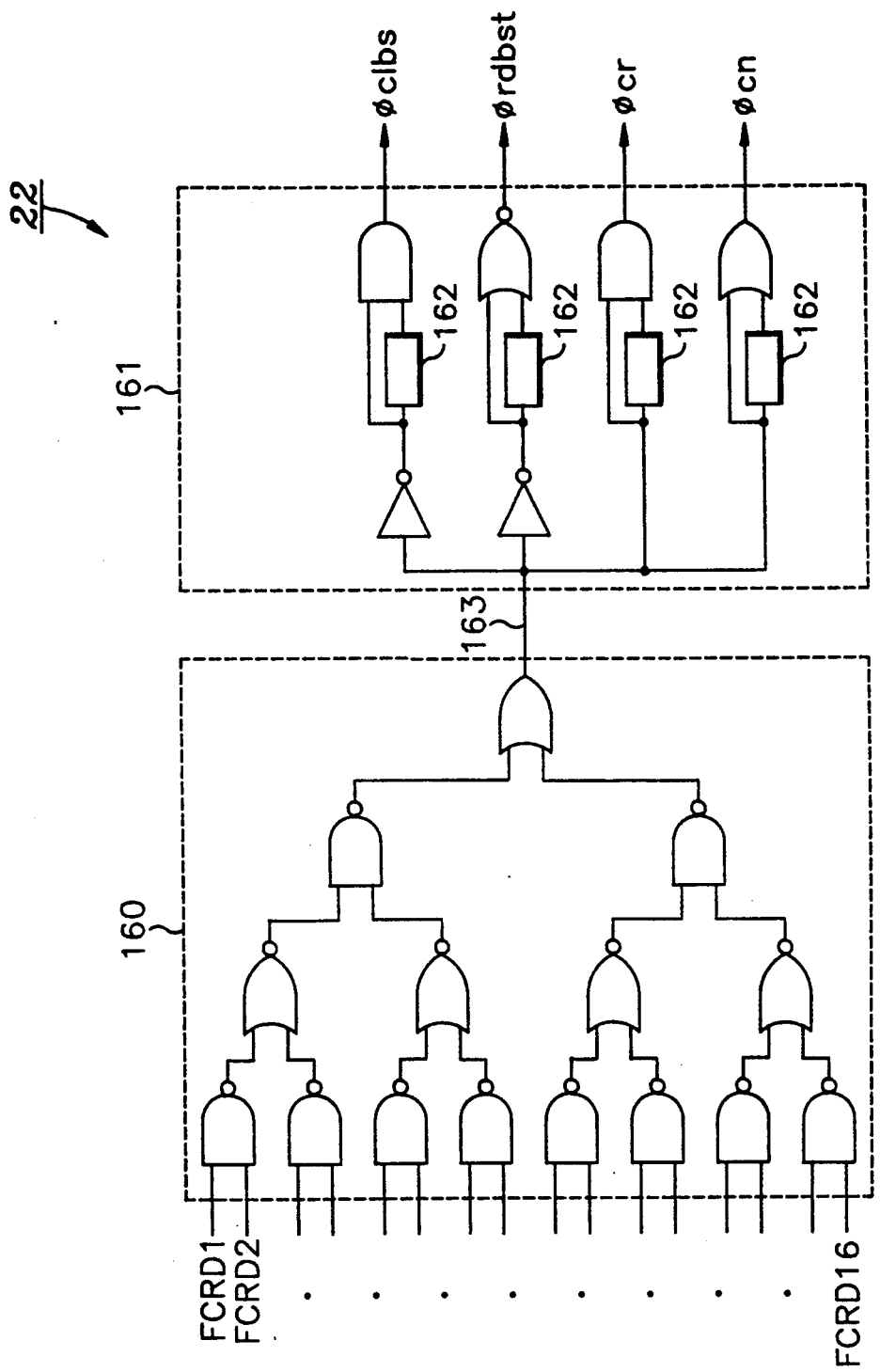
FIG. 11 is a logic circuit diagram of a redundant clock generator in FIG. 1.

FIG. 11 is showing a logic circuit diagram of the redundant clock generator 22 which includes means 160 for summing column redundant operation signals FCRD1 to FCRD16 from the redundant column decoder RCD to generate a redundant control signal and a timing circuit 161 for controlling the timing of the redundant control signal. Reference numerals 162 represent delay circuits, 164 NAND gate, 165 NOR gates, and 166 AND gates. In the normal operation which does not perform the replacement of defective normal column, since the output signals FCRD1 to FCRD16 of the redundant column decoder RCD are all at high states, the output line 163 of the summing means 160 keeps at a low state, thereby holding the second redundant control signal $\phi$clbs at a high state and the first, third and fourth redundant control signals $\phi$cn, $\phi$rdbst and $\phi$cr at low states. On the contrary, in the column replacing operation, since one of the signals FCRD1 to FCRD16 goes to a low state, the output line 163 of the summing means 160 goes to a high state, thereby rendering the first, third and fourth redundant control signals $\phi$cn, $\phi$rdbst and $\phi$cr to high states and the second redundant control signal $\phi$clbs to a low state.

Figure 12:
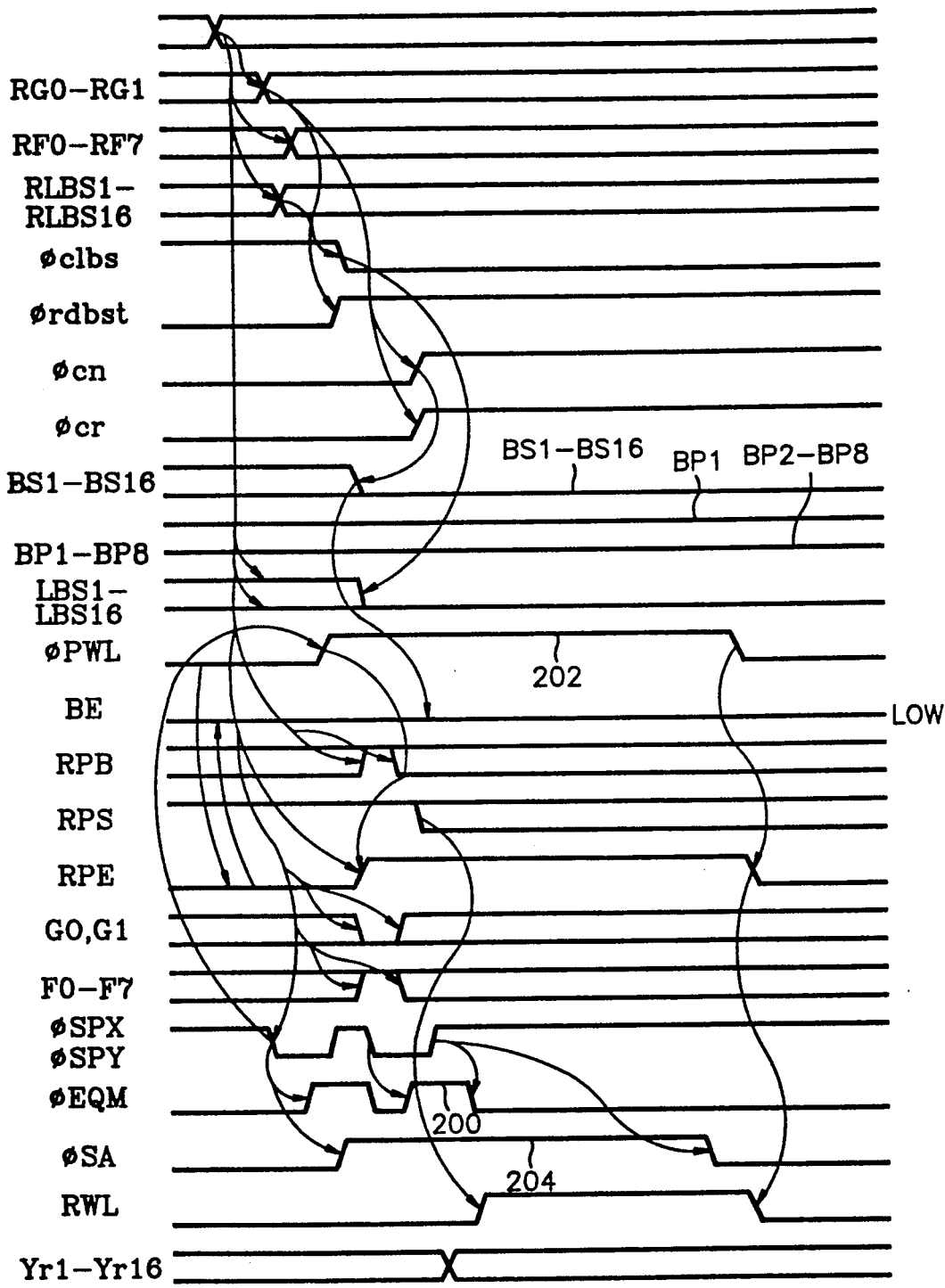
FIG. 12 is a timing diagram for explaining a read operation in the semiconductor memory device in FIG. 1.

Hereinbelow, Explanation will be made about a read operation of the block column redundancy according to the present invention. For the convenience of explanation, it will be explained, after a defect-free normal memory cell in the first normal block NBL1 has been read out, about reading a defective normal memory cell in the first normal block NBL1 in reference with the timing diagram of FIG. 12. It will be assumed that the programming for replacing the defective normal memory cell has already been performed.

The chip-select signal CS and the write enable signal WE from the buffer 10 are at low states in the read operation. The column predecoder 20 produces redundant column predecoding signals RG0, $\overline{RG1}$ and RF0 to RF7 in response to address signals (A8, $\overline{A8}$) to (A11, $\overline{A11}$) from the buffer 10. On the other hand, when the defect-free normal memory cell in the normal block NBL1 was read out, the second redundant control signal $\phi$clbs and the first, third and fourth redundant control signals $\phi$cn, $\phi$rdbst and $\phi$cr are respectively at a high state and low states. The block decoder 18 provides block selecting signals RLBS1 to RLBS16 in response to address signals (A0, $\overline{A0}$) to (A3, $\overline{A3}$) from the address buffer. Then, the redundant column decoder RCD detects that input address signals are addressing the defective normal memory cell in response to the signals RG1, RG0, RF0 to RF7 and RLBS1 to RLBS16, and renders one of the redundant operating pulse signals FCRD1 to FCRD16, i.e., the output of one program device programmed to replace the defective normal column, to a low state. Therefore, the redundant clock generator 22 makes the second redundant control signal $\phi$clbs and the first, third and fourth redundant control signals $\phi$cn, $\phi$rdbst and $\phi$cr be changed into a low state and high states, respectively. On the other hand, the precharging clock signal $\phi$BLM keeps at a high state with the low state of WE, and the equalizing clock signal $\phi$EQM, the word line selecting clock signal $\phi$PWL and the sense amplifier enable clock signal $\phi$SA respectively take timing signals represented by reference numerals 200, 202 and 204 in response to changes of address signals A0 to A16 and the third redundant control signal $\phi$rdbst. The second redundant control signal $\phi$clbs of the low state renders all of the signals LBS1 to LBS16 from the block decoder 18 to low states, and the first redundant control signal $\phi$cn of the high state renders all of the signals BS1 to BS16 from the block decoder 18 to low states. The low states of the signals LBS1 to LBS16 cause all of normal precharge circuits NPC, normal sense amplifiers SA1 to SA8 and normal column decoders NCD1 to NCD16 associated with normal blocks NBL1 to NBL16 to disable. The row predecoder 16 produces the signals BE of low states in response to the signals BS1 to BS16 of the low states, thereby disabling all of the normal row decoders NRD1 to NRD8. However, the row predecoder 16 generates redundant row selecting signals RPS and RPE in response to the clock signal $\phi$PWL of the high state, the signals BP1 to BP8 from the block decoder 18, address signals (A4, $\overline{A4}$) to (A7, $\overline{A7}$) and (A12, $\overline{A12}$) to (A16, $\overline{A16}$) and the redundant control signals $\phi$rdbst and $\phi$cr thereby activating one selected redundant row line to a high state. Also, the redundant precharge circuit RPC and the redundant sense amplifiers RSA1 to RSA8 are activated or enabled by the third redundant control signal $\phi$rdbst of the high state. Therefore, data may be read out from the redundant column selected by the redundant column decoder RCD.

As discussed above, during the read operation from the selected memory cell in the redundant block, disabling all of normal precharge circuits, normal sense amplifiers and normal row and column decoders gives the result of preventing power dissipation.

On the other hand, after the selected memory cell in the redundant block has been read out, reading out the selected memory cell in the normal block renders all of the output signals FCRD1 to FCRD16 of the redundant column decoder RCD to high states. Therefore, the control signal $\phi$clbs goes to a high state and control signals $\phi$cn, $\phi$rdbst and $\phi$cr go to low states, thereby disabling the redundant precharge circuit RPC, the redundant sense amplifiers RSA1 to RSA8 and the redundant row decoder RRD.

In a write operation, since the control operation of clock signals $\phi$cn, $\phi$clbs, $\phi$cr and $\phi$rdbst from the redundant clock generator and output signals from the block decoder for preventing the power dissipation is the same manner as that in the read operation, more explanation will not be made.

As described above, since the present invention arranges a separate redundant block in the semiconductor memory device containing a plurality of memory array blocks, and enables or disables precharge circuits, sense amplifiers and row and column decoders coupled to the respective blocks with the redundant control clock signal, it has an advantage of reducing the power consumption.

While the invention has been particularly shown and described with reference to a preferred embodiment, it will be understood by those skilled in the art that modifications in detail may be made without departing from the spirit and scope of the invention.

What is claimed is:

1. A semiconductor memory device, comprising:
    a plurality of normal blocks each having a plurality of normal row lines and bit lines pairs, each of which respectively contains a plurality of normal memory cells thereto and therebetween, the normal bit line pairs in the respective normal blocks being arranged to form a plurality of normal bit line pair groups;
    a redundant block having a plurality of redundant row lines and bit line pairs, each of which respectively contains a plurality of redundant memory cells thereto and therebetween, the redundant bit line pairs in the redundant block being arranged to form redundant bit line pair groups whose number is equal to that of the normal bit line pair groups;
    block decoder means for generating block selecting signals selecting one of the normal blocks in response to first address signals;
    column predecoder means for producing column predecoding signals selectively addressing one of normal bit line pairs in the respective normal bit line pair groups in each of the normal blocks and one of redundant bit line pairs in the respective redundant bit line pair groups in response to second address signals;
    a redundant column decoder for selecting, upon receipt of the block selecting signals and the column predecoding signals addressing a normal bit line pair containing a defective normal memory cell, redundant bit line pairs in the respective redundant bit line pair groups corresponding to the defective normal bit line pair, said redundant column decoder producing redundant operation signals, when selecting the redundant bit line pairs;
    means for producing redundant control signals upon receipt of the redundant operation signals;and
    a plurality of normal column decoders associated with the respective normal blocks, one of the normal column decoders being enabled in response to said block selecting signals when a defect-free normal memory cell is addressed and selecting normal bit line pairs containing a normal bit line pair having the defect-free normal memory cell in the respective normal bit line pair groups in the addressed normal block, said plurality of normal column decoders all being disabled in response to said redundant control signals when a defective normal memory cell is addressed.

2. The semiconductor memory device of claim 1, wherein said plurality of normal blocks contain only normal memory cells, and said redundant block contain only redundant memory cells.

3. The semiconductor memory device of claim 1, further comprising:
    a plurality of normal precharging means each associated with a respective one of normal bit line pairs in the respective corresponding normal block of said plurality of normal blocks for precharging and equalizing a selected normal but line pair, said plurality of normal precharging means all being disabled in response to one of said redundant control signals when the defective normal memory cell is addressed;
    a redundant precharging means associated with a respective redundant bit line pairs in said redundant block for precharging and equalizing a selected redundant bit line pair, said redundant precharging means being enabled in response to said one of said redundant control signals when said defective normal memory cell is addressed;
    a plurality of normal sensing means each associated with a respective one of normal bit line pairs in the respective corresponding normal block of said plurality of normal blocks for sensing data stored in selected normal memory cells in one of said plurality of normal blocks, said plurality of normal sensing means all being disabled in response to said one of said redundant control signals when the defective normal memory cell is addressed; and redundant sensing means associated with a respective redundant bit line pairs in said redundant block for sensing data store in selected redundant memory cells in said redundant block, said redundant sensing means being enabled in response to said one of said redundant control signals when said defective normal memory cell is addressed.

4. The semiconductor memory device of claim 1, further comprising:
   row precoder means for producing signals selectively addressing one of normal row line pairs in each of the normal blocks and one of redundant row line pairs in response to third address signals; and
   a plurality of normal row decoders associated with the respective normal blocks, one of the normal row decoders being enabled in response to selected ones of said row predecoding signals when a defect-free normal memory cell is addressed and selecting normal row line pairs containing a normal row line pair having defect-free normal memory cells in the respective normal row line pair groups in the addressed normal block, said plurality of normal row decoders all being disabled in response to said redundant control signals when a defective normal memory cell is addressed.

5. The semiconductor memory device of claim 4, wherein said block decoder means further generates said row and normal column decoder selecting signals for selectively disabling and enabling one of the normal row and column decoders from said plurality of normal column decoders and said plurality of row decoders in response to one of said redundant control signals.

6. The semiconductor memory device of claim 4, wherein said block decoder means comprises:
   an array of AND gates having input terminals coupled to receive each of a first plurality of said first address signals and output terminals for providing said normal block pair selecting signals;
   an array of NAND gates having input terminals coupled to receive different pairs of said first address signals and output terminals for providing a plurality of intermediate address signals;
   a first NOR gate having an input terminal coupled to receive a chip-selecting signal and said plurality of intermediate address signals and an output terminal for providing said block selecting signals;
   a second NAND gates having a first input terminal coupled to receive said block selecting signals an output terminal for providing a first logic signal;
   a delay circuit coupled between said output terminal of said first NOR gate and a second input terminal of said second NAND gate for providing a second logic signal;
   a second NOR gate having a first input terminal coupled to receive said second logic signal, a second input terminal coupled to receive a first one of said redundant control signals and an output terminal for providing said row and normal column decoder selecting signals; and
   a second AND gate having an input terminal coupled to receive said block selecting signals, and a second one of said redundant control signals and an output terminal for providing normal precharge and normal sense selecting signals.

7. A static random access memory device, comprising:
   a plurality of normal blocks each having a plurality of normal memory cells arranged in matrix form of normal rows and columns, each normal column having a pair of normal bit lines between which normal memory cells arranged in respective normal columns are connected;
   a redundant block having a plurality of redundant memory cells arranged in redundant rows and columns of equal numbers to said normal rows and columns of each of the respective normal blocks, each redundant column having a pair of redundant bit lines between which redundant memory cells arranged in respective redundant columns are connected, said redundant bit line pairs being for replacing defective normal bit line pairs;
   means for providing first selecting signals and second selecting signals in response to first address signals;
   normal column decoding means, associated with respective ones of said normal blocks, for selecting defect-free normal bit line pairs, when said normal bit line pairs are designated by second address signals, in response to said second address signals and said second selecting signals, said normal column decoding means being disabled by redundant control signals when defective normal bit line pairs are designated;
   redundant column decoding means, responsive to said second address signals, and said first selecting signals, for respectively selecting redundant bit line pairs corresponding to the respective defective normal bit line pairs and providing redundant operating signals; and
   means for generating said redundant control signals in response to said redundant operating signals.

8. The static random access memory device of claim 7, further comprising:
   a plurality of normal precharging means each associated with a respective one of normal bit line pairs in the respective corresponding normal blocks, said normal precharging means being disabled by one of said redundant control signals, upon designation of defective normal bit line pairs; and
   redundant precharging means each associated with a respective one of redundant bit line pairs in the redundant block, said redundant precharging means being enabled by said one of said redundant control signals upon said designation.

9. The static random access memory device of claim 7, further comprising:
   normal sensing means each associated with a respective one of normal bit line pairs in the respective normal blocks, said normal sensing means being disabled by one of said redundant control signals upon designation of defective normal bit line pairs; and
   redundant sensing means each associated with a respective one of redundant bit line pairs in the redundant block, said redundant sensing means being enabled by said one of said redundant control signals upon said designation.

10. A semiconductor memory device, comprising:
    a plurality of normal blocks, each having a plurality of normal memory cells arranged in normal rows and columns;
    a redundant block having a plurality of redundant memory cells arranged in redundant rows and columns, said redundant rows and columns being equal in number to said normal rows and columns in respective normal blocks;

block decoding means for generating block selecting signals to enable selection of one of the normal blocks in response to first address signals;

redundant column decoding means, responsive to said block selecting signals and second address signals, for selecting redundant columns corresponding to said defective normal columns and generating redundant operating signals;

redundant clock generating means, responsive to said redundant operating signals, for producing redundant control signals; and normal column decoding means associated with the normal columns of the respective normal blocks, for enabling replacement of defective normal columns of the respective normal blocks with redundant columns from the redundant block, said normal column decoding means being disabled by said redundant control signals upon said replacement.

11. A semiconductor memory device, comprising:

a plurality of normal blocks each having normal memory cells arranged in a set number of normal rows and columns;

a redundant block having redundant memory cells arranged in said set number of redundant rows and columns, said respective redundant columns being for replacement of defective normal columns;

first generating means, operably connected to receive first address signals and a first control signal, for producing first selecting signals and second selecting signals therefrom;

first decoding means, associated with respective ones of said normal blocks, for decoding said second selecting signals to select normal columns therein in response to second address signals, and said second selecting signals;

second decoding means, operably connected to receive said first selecting signals and said second address signals, for decoding said first selecting signals when a selected normal column is defective, to select a redundant column corresponding thereto and for providing redundant operating signals; and second generating means for producing said first control signal in response to said redundant operating signals, whereby said first decoding means are all disabled upon the replacement.

12. A semiconductor memory device, comprising:

a plurality of normal blocks each containing a plurality of normal memory cells, and having a plurality of normal row lines and normal column lines connected to said normal memory cells;

a redundant block containing a plurality of redundant memory cells, and having a plurality of redundant row lines and redundant column lines connected to said redundant memory cells, said redundant row lines and redundant column lines being respectively equal in number to said normal row lines and normal column lines of each normal block;

first decoder means for providing block selecting signals to enable selection of one of said plurality of normal blocks in response to first address signals;

second decoder means programmable for selecting substitute column lines from among said plurality of redundant column lines in response to said block selecting signals and second address signals and for producing redundant operational signals in response to addressing of defective ones of said plurality of normal memory cells;

generating means for producing redundant control signals in response to said redundant operational signals; and third decoder means associated with corresponding ones of said normal memory cells, disabled by said redundant control signals when said defective ones of said plurality of normal memory cells are addressed, for selecting said normal column lines in response to said second address signals.

13. The semiconductor memory device of claim 12, further comprised of:

redundant precharge means connected for precharging said redundant column lines; and normal precharge means connected for precharging said normal column lines.

14. The semiconductor memory device of claim 13, further comprised of:

a plurality of redundant sense means connected for amplifying signals addressed to said redundant column lines; and a plurality of normal sense means connected for amplifying signals addressed to said normal column lines.

15. The semiconductor memory device of claim 12, further comprised of:

a plurality of redundant sense means connected for amplifying signals addressed to said redundant column lines; and a plurality of normal sense means connected for amplifying signals addressed to said normal column lines.

16. The semiconductor memory device of claim 12, further comprising:

a plurality of normal precharging means each associated with a respective one of said normal column line pairs in the respective corresponding normal blocks, said plurality of normal precharging means being disabled by one of said redundant control signals, upon designation of defective normal column line pairs; and redundant precharging means associated with a respective one of said redundant column line pairs in the redundant block, said redundant precharging means being enabled by said one of said redundant control signals upon said designation.

17. The semiconductor memory device of claim 12, further comprising:

normal sensing means each associated with a respective one of said normal column lines pairs in the respective normal blocks, said normal sensing means being disabled by one of said redundant control signals upon designation of defective normal column line pairs; and redundant sensing means each associated with a respective one of said redundant column line pairs in the redundant block, said redundant sensing means being enabled by said one of said redundant control signals upon said designation.

18. The semiconductor memory device of claim 12, wherein first decoder means comprises:

means for producing normal block pair selecting signals to enable selection of the normal row lines of the respective normal block in response to said first address signals; and means for producing normal row/column decoder selecting signals and block selecting signals in response to a first one of said redundant control signals and said first address signals, and for producing normal precharge/sense amplifier selecting signals in response to a second one of said redundant control signals and said block selecting signals.

19. The semiconductor memory device of claim 12, wherein said third decoder means comprises:
   a first plurality of logic means coupled to receive one of said block selecting signals, for providing in response to said second address signals, a plurality of intermediate selecting signals; and
   a second plurality of logic means coupled to receive said intermediate selecting signals, for providing normal column selecting signals.

20. The semiconductor memory of claim 12, wherein said first decoder means comprises:
   an array of AND gates having input terminals coupled to receive each of a first plurality of said first address signals, and output terminals for providing normal block pair selecting signals to enable selection of the normal row lines of the respective normal blocks;
   an array of NAND gates having input terminals coupled to receive different pairs of said first address signals, and output terminals for providing a plurality of intermediate address signals; and
   means for producing normal row/column decoder selecting signals and said block selecting signals in response to a first one of said redundant control signals and said plurality of intermediate address signals, and for producing normal precharge/sense amplifier selecting signals in response to a second one of said redundant control signals and said block selecting signals.

21. The semiconductor memory of claim 20, wherein said producing means comprises:
   a first NOR gate having input terminal coupled to receive a chip-selecting signal and selected ones of said plurality of said intermediate address signals, and an output terminal for providing said block selecting signals;
   a delay circuit for delaying said block selecting signals for a delay period to provide delayed block selecting signals;
   a second NAND gate having an input terminal coupled to receive said block selecting signals and said delayed block selecting signals, and an output terminal for providing logic signals;
   a second NOR gate having an input terminal coupled to receive said logic signals and a first one of said redundant control signals for providing one of said normal row/column decoder selecting signals; and
   a second AND gate having an input terminal coupled to receive said block selecting signals and a second one of said second redundant control signals, and an output terminal for providing said normal precharge/sense amplifier selecting signals.

22. The semiconductor memory device of claim 20, wherein said second decoder means comprises:
   means coupled to receive different pluralities of said second address signals, for decoding said second address signals to provide normal column predecoding signals and redundant column predecoding signals;
   programmable means having input terminals coupled to receive said redundant column predecoding signals and a plurality of said block selecting signals, for generating said redundant operational signals; and
   logic means for converting said redundant operational signals into redundant column selecting signals.

23. The semiconductor memory device of claim 22, wherein said decoding means comprises:
   an AND gate coupled to receive a plurality of said second address signals, for providing one of said redundant column predecoding signals;
   a delay circuit for delaying said one of said redundant column predecoding signals for a delay period to provide a delayed one of said redundant column predecoding signals; and
   a NAND gate having an input terminal coupled to receive said one of said redundant column predecoding signals and said delayed one of said redundant column predecoding signals, and an output terminal providing one of said normal column predecoding signals.

24. The semiconductor memory device of claim 22, wherein said programmable means comprises:
   bias means coupled for applying a first potential to a first node;
   a plurality of logic stages having an output terminal for providing one of said redundant operational signals;
   a plurality of first switch means controlled by said first potential, connectable for applying pluralities of said block selecting signals to first input terminals of different ones of said logic stages;
   a plurality of second switch means controlled by said first potential, connectable for applying pluralities of said redundant column predecoding signals to second input terminals of different one of said logic stages; and
   a plurality of third switch means controlled by said first potential, connectable for applying pluralities of said redundant column predecoding signals to third input terminals of different ones of said logic stages.

25. The semiconductor memory device of claim 22, wherein logic means comprises:
   a delay circuit for delaying one of said redundant operation signals for a delay period to provide a delayed one of said redundant operation signals;
   a NOR gate having an input terminal coupled to receive one of said redundant operation signals and said delayed one of said redundant operation signals, and an output terminal for providing one of said redundant column selecting signals.

26. The semiconductor memory device of claim 12, wherein said plurality of normal blocks contain only normal memory cells, and said redundant block contain only redundant memory cells.

27. The semiconductor memory device of claim 12, wherein said second decoder means comprises:
   means coupled to receive different pluralities of said second address signals, for decoding said second address signals to provide normal column predecoding signals and redundant column predecoding signals;
   programmable means having input terminals coupled to receive said redundant column predecoding signals and said block selecting signals, for generating said redundant operational signals; and
   logic means for converting said redundant operational signals into redundant column selecting signals.

28. The semiconductor memory device of claim 27, wherein said decoding means comprises:
- an AND gate having an input terminal coupled to receive a plurality of said second address signals, and an output terminal for providing one of said redundant column predecoding signals;
- a delay circuit for delaying said one of said redundant column predecoding signals for a delay period to provide a delayed one of said redundant column predecoding signals; and
- a NAND gate having an input terminal coupled to receive said one of said redundant column predecoding signals and said delayed one of said redundant column predecoding signals, and an output terminal for providing one of said normal column predecoding signals.

29. The semiconductor memory device of claim 27, wherein said programmable means comprises:
- bias means coupled for applying a first potential to a first node;
- a plurality of logic stages having an output terminal for providing one of said redundant operational signals;
- a plurality of first switch means controlled by said first potential, connectable for applying pluralities of said block selecting signals to first input terminals of different ones of said logic stages;
- a plurality of second switch means controlled by said first potential, connectable for applying pluralities of said redundant column predecoding signals to second input terminals of different ones of said logic stages; and
- a plurality of third switch means controlled by said first potential, connectable for applying pluralities of said redundant column predecoding signals to third input terminals of different ones of said logic stages.

30. The semiconductor memory device of claim 27, wherein logic means comprises:
- a delay circuit for delaying one of said redundant operation signals for a delay period to provide a delayed one of said redundant operation signals;
- a NOR gate having an input terminal coupled to receive said one of said redundant operation signals and said delayed one of said redundant operation signals, and an output terminal for providing one of said redundant column selecting signals.

31. The semiconductor memory device of claim 27, wherein said third decoder means comprises:
- a first plurality of logic means coupled to receive one of said block selecting signals and a first plurality of said normal column predecoding signals, for providing a plurality of intermediate selecting signals; and
- a second plurality of logic means coupled to receive said intermediate selecting signals and a second plurality of said normal column predecoding signals, for providing normal column selecting signals.

32. The semiconductor memory device of claim 27, wherein said third decoder means comprises:
- a plurality of NAND gates arranged in pairs with a first input terminal of each of said NAND gates in each of said pairs coupled to receive different ones of a first plurality of said normal column predecoding signals and a second input terminal of each one of said NAND gates coupled to receive one of said block selecting signals; and
- a plurality of NOR gates arranged in pairs with a first input terminal of each of said NOR gates in each of said pairs coupled to output terminals of different ones of said NAND gates in corresponding pairs of said NAND gates and a second input terminal of each one of said NOR gates coupled to receive different ones of a second plurality of said normal column predecoding signals.

* * * * *

UNITED STATES PATENT AND TRADEMARK OFFICE
CERTIFICATE OF CORRECTION

PATENT NO.    :   5,297,085
DATED         :   March 22, 1994
INVENTOR(S)   :   Kyu-Hyun Choi; et al.

It is certified that error appears in the above-indentified patent and that said Letters Patent is hereby corrected as shown below:

IN THE CLAIMS

| | | |
|---|---|---|
| Column 12, | Line 24, | Change "signals;and" to --signals; and-- ; |
| Column 13, | Line 10, | Preceding "signals", Insert --row predecoding-- ; |
| | Line 48, | After "signals", Insert --and-- ; |
| Column 18, | Line 34, | Change "one" to --ones-- . |

Signed and Sealed this

Twenty-ninth Day of November, 1994

Attest:

BRUCE LEHMAN

*Attesting Officer*  *Commissioner of Patents and Trademarks*